(12) United States Patent
Michigami et al.

(10) Patent No.: US 12,519,452 B2
(45) Date of Patent: Jan. 6, 2026

(54) ACOUSTIC WAVE DEVICE

(71) Applicant: Murata Manufacturing Co., Ltd., Nagaokakyo (JP)

(72) Inventors: Akira Michigami, Nagaokakyo (JP); Koji Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 764 days.

(21) Appl. No.: 17/960,257

(22) Filed: Oct. 5, 2022

(65) Prior Publication Data

US 2023/0022219 A1    Jan. 26, 2023

Related U.S. Application Data

(63) Continuation of application No. PCT/JP2021/014195, filed on Apr. 1, 2021.

(30) Foreign Application Priority Data

Apr. 6, 2020  (JP) .................. 2020-068249

(51) Int. Cl.
*H03H 9/13*   (2006.01)
*H03H 9/17*   (2006.01)

(52) U.S. Cl.
CPC .............. *H03H 9/13* (2013.01); *H03H 9/171* (2013.01)

(58) Field of Classification Search
CPC .......... H03H 9/145; H03H 9/13; H03H 9/171; H03H 9/14538
See application file for complete search history.

(56) References Cited

U.S. PATENT DOCUMENTS

| | | | |
|---|---|---|---|
| 7,135,805 B2* | 11/2006 | Yamanouchi | H03H 9/14538 310/313 R |
| 7,939,989 B2* | 5/2011 | Solal | H03H 9/1452 310/313 C |
| 2012/0161577 A1* | 6/2012 | Abbott | H03H 9/02724 310/313 C |

(Continued)

FOREIGN PATENT DOCUMENTS

| | | |
|---|---|---|
| JP | 2019080093 A | 5/2019 |
| WO | 2012127793 A1 | 9/2012 |
| WO | 2017013945 A1 | 1/2017 |

OTHER PUBLICATIONS

International Search Report in PCT/JP2021/014195, mailed Jun. 8, 2021, 3 pages.

(Continued)

*Primary Examiner* — J. San Martin
(74) *Attorney, Agent, or Firm* — Keating & Bennett, LLP

(57) ABSTRACT

An acoustic wave device includes an electrode finger on a principal surface of a piezoelectric substrate and extending in a Y-axis direction. In the acoustic wave device, an acoustic wave velocity is distributed in an order of an intermediate velocity, a low velocity, and a high velocity from a center of the electrode finger toward outer side portions in the Y-axis direction. The acoustic wave device further includes a dielectric between the piezoelectric substrate and a tip-end portion of the electrode finger. An end surface of the dielectric in the Y-axis direction includes first and second side surfaces. A tilt angle of the first side surface is smaller than a tilt angle of the second side surface.

16 Claims, 10 Drawing Sheets

(56) References Cited

U.S. PATENT DOCUMENTS

| | | | |
|---|---|---|---|
| 2014/0001919 A1 | 1/2014 | Komatsu et al. | |
| 2017/0155373 A1 | 6/2017 | Ruby et al. | |
| 2018/0097501 A1 | 4/2018 | Kikuchi et al. | |
| 2019/0123713 A1 | 4/2019 | Daimon | |
| 2019/0296715 A1* | 9/2019 | Okunaga | H03H 9/14541 |
| 2021/0376812 A1* | 12/2021 | Mayer | H03H 9/6496 |
| 2023/0039830 A1* | 2/2023 | Daimon | H03H 9/25 |
| 2024/0364300 A1* | 10/2024 | Daimon | H03H 9/568 |
| 2025/0266805 A1* | 8/2025 | Huck | H03H 9/02834 |

OTHER PUBLICATIONS

Written Opinion in PCT/JP2021/014195, mailed Jun. 8, 2021, 3 pages.

\* cited by examiner

COMPARATIVE MODEL 1

COMPARATIVE MODEL 2

COMPARATIVE MODEL 1

COMPARATIVE MODEL 2

MODEL OF THIS DISCLOSURE

MODIFICATION MODEL 1

COMPARATIVE MODEL 2

MODIFICATION MODEL 2

ACOUSTIC WAVE DEVICE

CROSS REFERENCE TO RELATED APPLICATIONS

This application claims the benefit of priority to Japanese Patent Application No. 2020-068249 filed on Apr. 6, 2020 and is a Continuation Application of PCT Application No. PCT/JP2021/014195 filed on Apr. 1, 2021. The entire contents of each application are hereby incorporated herein by reference.

BACKGROUND OF THE INVENTION

1. Field of the Invention

The present disclosure relates to an acoustic wave device which utilizes a piston mode.

2. Description of the Related Art

Conventionally, acoustic wave devices which utilize a piston mode to suppress unwanted waves have been proposed. A piston mode is a technology which brings an effective electromechanical coupling coefficient in a mode other than a fundamental mode closer to zero by making an acoustic velocity of acoustic waves (a propagating velocity of the acoustic waves in a propagation direction) to be distributed in an order of an intermediate velocity, a low velocity, and a high velocity from the center in a direction orthogonal to the propagation direction of the acoustic waves toward both outer side portions.

For example, U.S. Patent Application Publication No. 2017/0155373 discloses one example of an acoustic wave device which utilizes the piston mode. This acoustic wave device is provided with a piezoelectric substrate and an interdigital transducer (IDT) electrode provided on the piezoelectric substrate. The IDT electrode includes a first busbar and a second busbar opposed to each other and extending in a propagation direction of acoustic waves, a plurality of first electrode fingers connected at one ends to the first busbar and extending in a direction orthogonal to the acoustic wave propagation direction, and a plurality of second electrode fingers connected at one ends to the second busbar and extending in the direction orthogonal to the acoustic wave propagation direction. The plurality of second electrode fingers are each disposed to be inserted between the plurality of first electrode fingers. A dielectric is provided between a tip-end portion of each electrode finger and the piezoelectric substrate. In this manner, the acoustic wave device which utilizes the piston mode is formed. Specifically, an acoustic wave velocity in a first edge portion including tip-end portions of the plurality of first electrode fingers and an acoustic wave velocity in a second edge portion including tip-end portions of the plurality of second electrode fingers are configured to be lower than an acoustic wave velocity in a middle portion between the first edge portion and the second edge portion. Further, an acoustic wave velocity in a portion on the outer side of the first and second edge portions with respect to the middle portion is configured to be higher than the acoustic wave velocity in the middle portion.

U.S. Patent Application Publication No. 2017/0155373 discloses a configuration in which a side surface of the dielectric (an end surface in the extending direction of the electrode finger) has one plan shape vertical to a principal surface of the piezoelectric substrate (hereinafter, may simply be referred to as a "vertical shape") or one plan shape inclined with respect to the principal surface of the piezoelectric substrate (hereinafter, may simply be referred to as a "tapered shape").

When the side surface of the dielectric has the vertical shape, a spurious mode can easily be suppressed since a sharp difference in the acoustic velocity can easily be formed between the middle portion and the first and second edge portions. However, there is a concern that stress easily acts on the piezoelectric substrate around the dielectric and polarization reversal in piezoelectric material included in the piezoelectric substrate easily occurs.

On the other hand, when the side surface of the dielectric has the tapered shape, the stress which acts on the piezoelectric substrate around the dielectric can be reduced, thus an occurrence of the polarization reversal is difficult. However, since formation of the sharp acoustic velocity difference between the middle portion and the first and second edge portions becomes difficult, there is a concern that suppressing the occurrence of the spurious mode becomes difficult.

SUMMARY OF THE INVENTION

Preferred embodiments of the present provide acoustic wave devices each utilizing a piston mode and that are each able to reduce or prevent an occurrence of a spurious mode while reducing or preventing polarization reversal in a piezoelectric substrate.

An acoustic wave device according to a preferred embodiment of the present includes a piezoelectric substrate, an IDT electrode on a principal surface of the piezoelectric substrate, a first dielectric, and a second dielectric. The IDT electrode includes a first busbar and a second busbar opposed to each other, a first electrode finger connected at one end to the first busbar and extending toward the second busbar, and a second electrode finger connected at one end to the second busbar and extending toward the first busbar. The first electrode finger and the second electrode finger are interdigitated with each other. The first dielectric is between at least one of a tip-end portion of the first electrode finger and a portion of the second electrode finger and the piezoelectric substrate, the portion of the second electrode finger being adjacent to the tip-end portion of the first electrode finger. The second dielectric is between at least one of a tip-end portion of the second electrode finger and a portion of the first electrode finger and the piezoelectric substrate, the portion of the first electrode finger being adjacent to the tip-end portion of the second electrode finger. When a portion including the tip-end portion of the first electrode finger is a first edge portion, a portion including the tip-end portion of the second electrode finger is a second edge portion, a portion between the first edge portion and the second edge portion is a middle portion, a portion on an outer side of the first edge portion with respect to the middle portion is a first outer portion, and a portion on an outer side of the second edge portion with respect to the middle portion is a second outer portion, an acoustic wave velocity in the first edge portion and the second edge portion is lower than an acoustic wave velocity in the middle portion, and a portion in which an acoustic wave velocity is higher than the acoustic wave velocity in the middle portion exists in the first outer portion and the second outer portion. In each of the first dielectric and the second dielectric, at least one of an end surface in an extending direction of the first electrode finger and an end surface in an extending direction of the second electrode finger includes a first surface and a second surface farther from the piezoelectric substrate than the first surface. A tilt angle of the first surface with respect to the principal surface of the piezoelectric substrate is smaller than a tilt angle of the second surface with respect to the principal surface of the piezoelectric substrate.

According to preferred embodiments of the present disclosure, in acoustic wave devices which each utilize the piston mode, an occurrence of the spurious mode is able to be reduced or prevented while the polarization reversal in the piezoelectric substrate is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
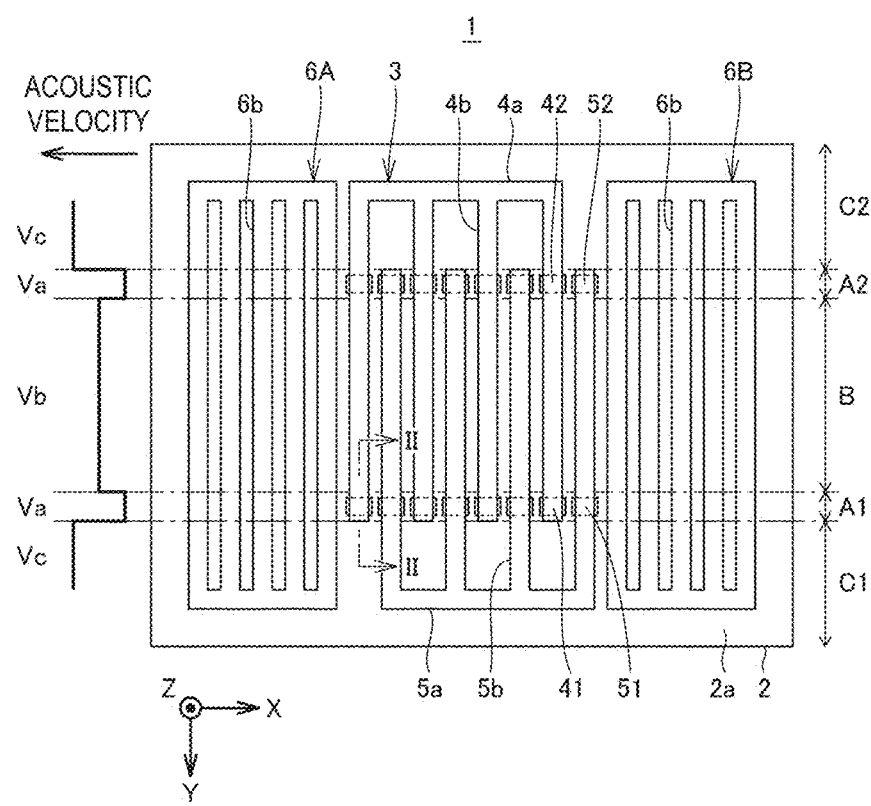
FIG. 1 is a plan view of an acoustic wave device according to a preferred embodiment of the present invention.

Hereinafter, preferred embodiments of the present disclosure are described in detail with reference to the drawings. The same or corresponding portions in the drawings are referred to by the same reference characters and description thereof is omitted.

Figure 2:
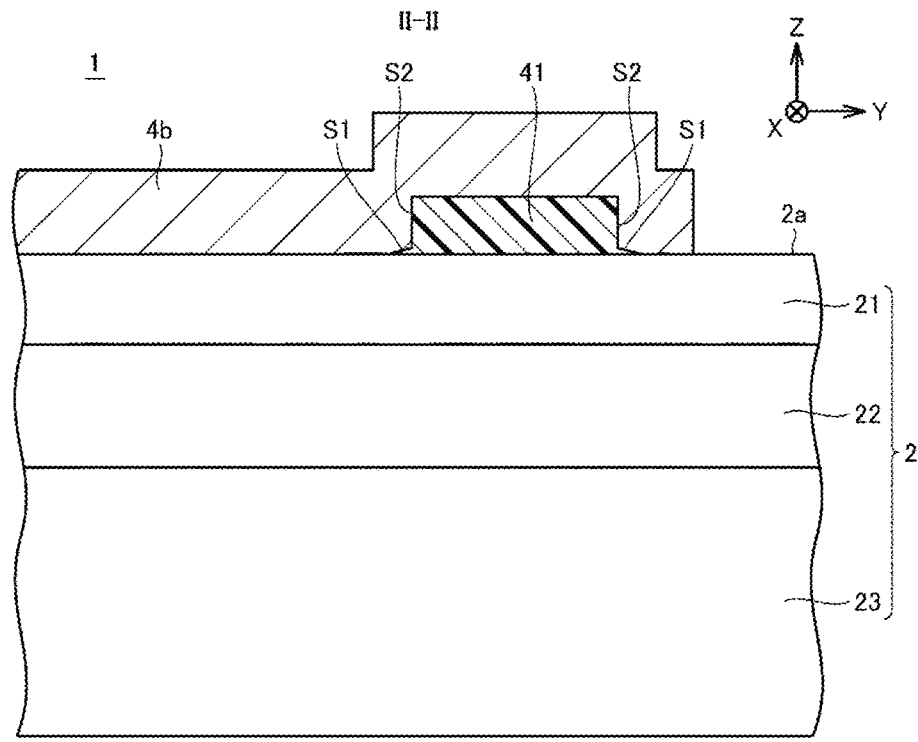
FIG. 2 is a sectional view of the acoustic wave device taken along a line II-II in FIG. 1.

FIG. 1 is a plan view of an acoustic wave device 1 according to a preferred embodiment of the present invention. FIG. 2 is a sectional view of the acoustic wave device 1 taken along a line II-II in FIG. 1.

The acoustic wave device 1 includes a piezoelectric substrate 2, an IDT electrode 3, a plurality of first dielectrics 41 and 51, a plurality of second dielectrics 42 and 52, and reflectors 6A and 6B. The IDT electrode 3 and the reflectors 6A and 6B are disposed on a principal surface 2a of the piezoelectric substrate 2.

Below, a propagation direction of an acoustic wave in the acoustic wave device 1 may also be referred to as an X-axis direction, a normal line direction of the principal surface 2a of the piezoelectric substrate 2 may also be referred to as a Z-axis direction, and a direction orthogonal or substantially orthogonal to the X-axis direction and the Z-axis direction may also be referred to as a Y-axis direction. The X-axis direction is one example of a "first direction" and the Y-axis direction is one example of a "second direction".

The IDT electrode 3 includes a first busbar 4a, a plurality of first electrode fingers 4b, a second busbar 5a, and a plurality of second electrode fingers 5b. The first busbar 4a and the second busbar 5a extend in the X-axis direction and opposed to each other.

Each of the plurality of first electrode fingers 4b is connected at one end to the first busbar 4a and extends in the Y-axis direction toward the second busbar 5a. Each of the plurality of second electrode fingers 5b is connected at one end to the second busbar 5a and extends in the Y-axis direction toward the first busbar 4a. The plurality of first electrode fingers 4b and the plurality of second electrode fingers 5b are interdigitated with each other.

The IDT electrode 3 is, for example, an aluminum electrode. A material of the IDT electrode 3 is not limited to the above. The IDT electrode 3 may be made of, for example, a laminated metallic film. When alternating-current voltage is applied to the IDT electrode 3, an acoustic wave is excited and propagated in the X-axis direction.

The reflectors 6A and 6B are respectively disposed on both sides of the IDT electrode 3 in the X-axis direction. Each of the reflectors 6A and 6B includes a plurality of electrode fingers 6b. The reflectors 6A and 6B are made of, for example, a material the same as or similar to that of the IDT electrode 3.

In the present preferred embodiment, the piezoelectric substrate 2 has a layered structure in which a piezoelectric film is laminated on a supporting substrate. Specifically, as illustrated in FIG. 2, the piezoelectric substrate 2 is configured such that, from a closer side toward a farther side to and from the IDT electrode 3, a piezoelectric layer 21, a low velocity layer 22, and a high acoustic velocity supporting substrate 23 are laminated in this order.

The piezoelectric layer 21 is made of, for example, a piezoelectric film including lithium tantalate ($LiTaO_3$). The piezoelectric layer 21 includes, for example, 50° Y-cut X propagation $LiTaO_3$ piezoelectric single crystals or piezoelectric ceramics (lithium tantalate single crystals or ceramics which is cut by a plane whose normal line is an axis rotated by about 50° from a Y-axis about an X-axis as a center axis, and in which an acoustic wave propagates in an X-axis direction). The piezoelectric layer 21 has a thickness of, for example, about 3.5λ or smaller when a wavelength defined by an electrode finger pitch of the IDT electrode 3 is λ.

The high acoustic velocity supporting substrate 23 is a substrate which supports the piezoelectric layer 21 and the low velocity layer 22. The high acoustic velocity supporting substrate 23 is also a substrate configured such that an acoustic velocity of a bulk wave therein is higher than an acoustic velocity of an acoustic wave (for example, a surface acoustic wave and a boundary wave) which propagates on or in the piezoelectric layer 21. The high acoustic velocity supporting substrate 23 confines the acoustic wave in a portion where the piezoelectric layer 21 and the low velocity layer 22 are laminated so that the acoustic wave does not leak below the high acoustic velocity supporting substrate 23. A thickness of the high acoustic velocity supporting substrate 23 is, for example, about 120 μm.

The low velocity layer 22 is a film configured such that an acoustic velocity of a bulk wave therein is lower than an acoustic wave which propagates on or in the piezoelectric layer 21. The low velocity layer 22 is disposed between the piezoelectric layer 21 and the high acoustic velocity supporting substrate 23. A thickness of the low velocity layer 22 is, for example, about 670 nm. With such a layered structure of the piezoelectric substrate 2 and nature that energy of the acoustic wave essentially concentrates on a medium of a low velocity, leaking of the energy of the acoustic wave to the outside of the IDT electrode 3 is reduced or prevented. When compared to a structure in which the piezoelectric substrate 2 is used as a single layer, the layered structure can largely increase a Q value in a resonant frequency and an anti-resonant frequency. That is, since a surface acoustic wave resonator with a high Q value can be configured, a filter with a small insertion loss can be configured by using the acoustic wave resonator.

The low velocity layer 22 is made of a material whose main component is, for example, a compound in which fluorine, carbon, and/or boron are added to glass, silicon oxynitride, tantalum oxide, or silicon oxide. The material of the low velocity layer 22 may be any material with a relatively low acoustic velocity.

A material of the high acoustic velocity supporting substrate 23 may be piezoelectric material (for example, aluminum nitride, aluminum oxide, silicon carbide, silicon nitride, silicon, sapphire, lithium tantalate, lithium niobate, and a quartz), a ceramic (for example, alumina, zirconia, cordierite, mullite, steatite, and forsterite), magnesia diamond, a material whose main component is one of the above materials, or a material whose main component is a mixture of the above materials.

The high acoustic velocity supporting substrate 23 may have a structure in which a supporting substrate is laminated together with a high velocity film configured such that an acoustic velocity of a bulk wave propagating therein is higher than the acoustic velocity of the acoustic wave (for example, the surface acoustic wave and the boundary wave) which propagates on or in the piezoelectric layer 21. In this case, as the supporting substrate, for example, the followings may be used: piezoelectric material such as sapphire, lithium tantalate, lithium niobate, and a quartz; a ceramic such as alumina, magnesia, silicon nitride, aluminum nitride, silicon carbide, zirconia, cordierite, mullite, steatite, and forsterite; a dielectric such as glass; or a semiconductor such as silicon and gallium nitride; and a resin substrate. Further, for the high velocity film, various high velocity material, for example, aluminum nitride, aluminum oxide, silicon carbide, silicon nitride, silicon oxynitride, DLC film, diamond, a medium whose main component is the above-mentioned material, and a medium whose main component is mixture of the above materials, may be used.

The piezoelectric substrate 2 may be made of, for example, lithium tantalate ($LiTaO_3$) or piezoelectric single crystals other than the lithium tantalate ($LiTaO_3$), such as lithium niobate ($LiNbO_3$). The piezoelectric substrate 2 may be a substrate made of piezoelectric material without a supporting substrate.

The first dielectric 41 is disposed between a tip-end portion of the first electrode finger 4b (the end portion in the Y-axis positive direction illustrated in FIG. 1) and the piezoelectric substrate 2. The first dielectric 51 is disposed between a portion of the second electrode finger 5b adjacent to the tip-end portion of the first electrode finger 4b in the X-axis direction (hereinafter, may be referred to as an "adjacent portion of the second electrode finger 5b") and the piezoelectric substrate 2. FIG. 1 illustrates an example where the first dielectrics 41 and 51 do not intersect with an XZ plane which passes a tip end of the first electrode finger 4b. However, the first dielectrics 41 and 51 may intersect with the XZ plane which passes the tip end of the first electrode finger 4b.

The second dielectric 52 is disposed between a tip-end portion of the second electrode finger 5b (the end portion in the Y-axis negative direction illustrated in FIG. 1) and the piezoelectric substrate 2. The second dielectric 42 is disposed between a portion of the first electrode finger 4b adjacent to the tip-end portion of the second electrode finger 5b in the X-axis direction (hereinafter, may be referred to as an "adjacent portion of the first electrode finger 4b") and the piezoelectric substrate 2. FIG. 1 illustrates an example where the second dielectrics 42 and 52 do not intersect with an XZ plane which passes a tip end of the second electrode finger 5b. However, the second dielectrics 42 and 52 may intersect with the XZ plane which passes the tip end of the second electrode finger 5b.

Below, a portion including the tip-end portions of the plurality of first electrode fingers 4b and extending in the X-axis direction is defined as a "first edge portion A1", and a portion including the tip-end portions of the plurality of second electrode fingers 5b and extending in the X-axis direction is defined as a "second edge portion A2". The first edge portion A1 includes, in addition to the tip-end portions of the plurality of first electrode fingers 4b, the adjacent portions of the plurality of second electrode fingers 5b. Further, the second edge portion A2 includes, in addition to the tip-end portions of the plurality of second electrode fingers 5b, the adjacent portions of the plurality of first electrode fingers 4b.

Further, below, a portion between the first edge portion A1 and the second edge portion A2 is defined as a "middle portion B", a portion on the outer side of the first edge portion A1 with respect to the middle portion B is defined as a "first outer portion C1", and a portion on the outer side of the second edge portion A2 with respect to the middle portion B is defined as a "second outer portion C2".

The "first edge portion A1", the "second edge portion A2", the "middle portion B", the "first outer portion C1", and the "second outer portion C2" of the present preferred embodiment may respectively correspond to a "first edge portion", a "second edge portion", a "middle portion", a "first outer portion", and a "second outer portion".

In the acoustic wave device 1 according to the present preferred embodiment, the first dielectrics 41 and 51 are disposed in the first edge portion A1, and the second dielectrics 42 and 52 are disposed in the second edge portion A2. Therefore, an acoustic wave velocity Va in the first edge portion A1 and the second edge portion A2 becomes lower than an acoustic wave velocity Vb in the middle portion B.

Also, an acoustic wave velocity Vc in the first outer portion C1 and the second outer portion C2 becomes higher than the acoustic wave velocity Vb in the middle portion B. That is, the acoustic wave velocity is configured to be distributed in an order of the intermediate velocity Vb, the low velocity Va, and the high velocity Vc from the middle portion B toward both outer side portions in the Y-axis direction. In this manner, in the acoustic wave device 1 according to the present preferred embodiment, a transverse-mode spurious response can be reduced or prevented by utilizing the piston mode, and thus, a fundamental mode can efficiently be propagated.

The relationship between the acoustic velocities is Va<Vb<Vc, and such an acoustic velocity relationship is illustrated in FIG. 1. In FIG. 1, the acoustic velocity is indicated to increase toward the left.

Side Surface Shape of Dielectric

The shape of a side surface of each dielectric (the first dielectrics 41 and 51 and the second dielectrics 42 and 52) according to the present preferred embodiment is described below. As described above, in the present preferred embodiment, each of the first dielectrics 41 and 51 disposed in the first edge portion A1 is disposed between the piezoelectric substrate 2 and the tip-end portion of the first electrode finger 4b or the adjacent portion of the second electrode finger 5b. Further, each of the second dielectrics 42 and 52 disposed in the second edge portion A2 is disposed between the piezoelectric substrate 2 and the tip-end portion of the second electrode finger 5b or the adjacent portion of the first electrode finger 4b.

In such an arrangement, when the side surfaces (end surfaces in the Y-axis direction) of the dielectrics 41, 51, 42, and 52 have a simple vertical shape, it becomes easier to reduce or prevent a spurious mode since a sharp difference in an acoustic velocity can easily be provided between the middle portion B and each of the edge portions A1 and A2 and between each of the edge portions A1 and A2 and the outer portion C1 or C2. However, since stress easily acts on the piezoelectric substrate 2 around the dielectrics 41, 51, 42, and 52, there is a concern that polarization reversal may easily occur in the piezoelectric film of the piezoelectric substrate 2.

On the other hand, when the side surfaces of the dielectrics 41, 51, 42, and 52 have a simple tapered shape, the stress which acts on the piezoelectric substrate 2 around the dielectrics 41, 51, 42, and 52 is reduced, and the polarization reversal in the piezoelectric substrate 2 can be reduced or prevented. However, since formation of the sharp velocity difference between the middle portion B and each of the edge portions A1 and A2 and between each of the edge portions A1 and A2 and the outer portion C1 or C2 becomes difficult, there is a concern that reducing or preventing the occurrence of the spurious mode may become difficult.

In this respect, according to the present preferred embodiment, the side surfaces of the dielectrics 41, 51, 42, and 52 have the shape as illustrated in FIG. 2. In FIG. 2, the side surface shape of the first dielectric 41 is illustrated as an example. Since the side surface shapes of the dielectrics 41, 51, 42, and 52 are the same or substantially the same, the side surface shape of the first dielectric 41 is described below as an example.

As illustrated in FIG. 2, the side surface of the first dielectric 41 includes a first side surface S1 in contact with the piezoelectric substrate 2 and a second side surface S2 farther from the piezoelectric substrate 2 than the first side surface S1. The first side surface S1 and the second side surface S2 are both planes extending in the X-axis direction. The first side surface S1 is one example of a "first surface" in the end surface of the first dielectric 41 in the Y-axis direction. The second side surface S2 is one example of a "second surface" in the end surface of the first dielectric 41 in the Y-axis direction.

A tilt angle of the first side surface S1 with respect to the principal surface 2a of the piezoelectric substrate 2 (hereinafter, may simply be referred to as a "tilt angle of the first side surface S1") is smaller than a tilt angle of the second side surface S2 with respect to the principal surface 2a of the piezoelectric substrate 2 (hereinafter, may simply be referred to as a "tilt angle of the second side surface S2").

FIG. 2 illustrates an example in which both of the side surfaces of the first dielectric 41 in the Y-axis positive direction (the extending direction of the first electrode finger 4b) and in the Y-axis negative direction (the extending direction of the second electrode finger 5b) include the first side surface S1 and the second side surface S2. However, one of the side surfaces of the first dielectric 41 in the Y-axis positive direction and Y-axis negative direction may include the first side surface S1 and the second side surface S2.

Figure 3:
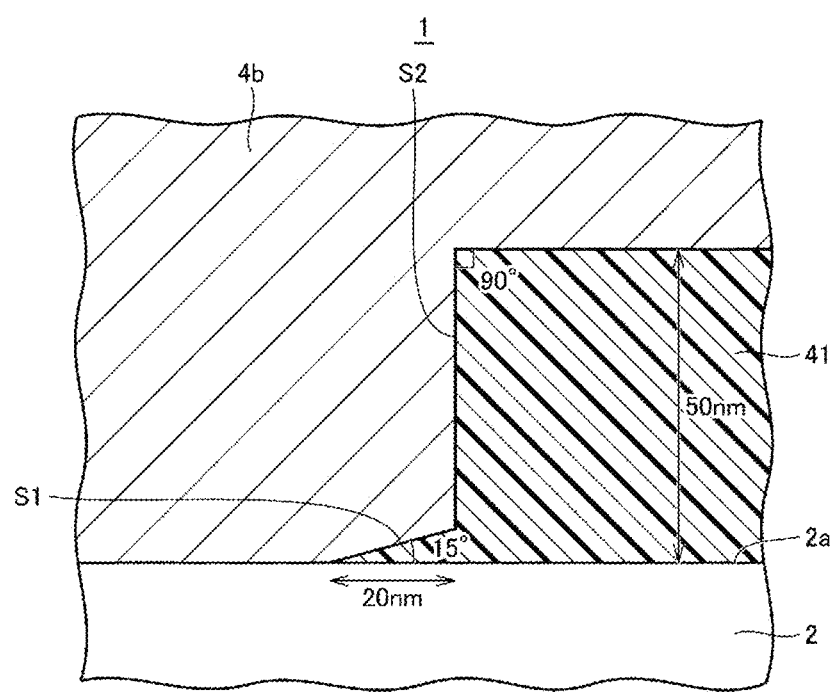
FIG. 3 is an enlarged view of a side surface portion of a dielectric according to a preferred embodiment of the present invention.

FIG. 3 is an enlarged view of a side surface portion of the first dielectric 41. As described above, the first side surface S1 and the second side surface S2 are provided on the side surface of the first dielectric 41. In the example illustrated in FIG. 3, the tilt angle of the first side surface S1 is, for example, about 15 degrees, and the tilt angle of the second side surface S2 is, for example, about 90 degrees. Further, a thickness of the first dielectric 41 (a width in the Z-axis direction) is, for example, about 50 nm, and a length of the first side surface S1 in the Y-axis direction is, for example, about 20 nm. An upper surface of the first dielectric 41 (an end surface in the Z-axis positive direction) is parallel or substantially parallel to the principal surface 2a of the piezoelectric substrate 2. The values of the tilt angles and lengths of each side surface are merely examples, and not limited thereto.

As described above, according to the present preferred embodiment, the side surface of the first dielectric 41 has the tilt angle which is different between the portion closer to the piezoelectric substrate 2 and the portion farther from the piezoelectric substrate 2. That is, the tilt angle of the first side surface S1 closer to the piezoelectric substrate 2 is made relatively smaller. Therefore, close contact between the first dielectric 41 and the first electrode finger 4b is improved, and the stress applied to the piezoelectric substrate 2 and the first electrode finger 4b can be reduced. Further, the tilt angle of the second side surface S2 farther from the piezoelectric substrate 2 is made relatively larger. Therefore, a portion in which the acoustic velocity changes (more specifically, a portion where the acoustic velocity changes from the intermediate velocity Vb in the middle portion B to the low velocity Va in the first edge portion A1, and a portion where the acoustic velocity changes from the low velocity Va in the first edge portion A1 to the high velocity Vc in the first outer portion C1) can be made smaller. Thus, a sharp difference in the acoustic velocity can easily be provided between the middle portion B and the first edge portion A1 and between the first edge portion A1 and the first outer portion C1.

As described above, the side surfaces of the dielectrics other than the first dielectric 41 (the first dielectric 51 and the second dielectrics 42 and 52) have the same or substantially the same shape as the side surface of the first dielectric 41. Therefore, the dielectrics 51, 42, and 52 other than the first dielectric 41 can also achieve advantageous effects the same as or similarly to the first dielectric 41. As a result, while providing the sharp acoustic velocity difference between the middle portion B and each of the edge portions A1 and A2 and between each of the edge portions A1 and A2 and the outer portion C1 or C2, the close contact between the dielectrics 41, 51, 42, and 52 and the corresponding electrode fingers 4b and 5b is improved, and the stress applied to the piezoelectric substrate 2 and the electrode fingers 4b and 5b can be reduced.

Stress Simulation Result

In order to verify the advantageous operations and effects described above, the inventors of preferred embodiments of the present invention conducted simulation using a finite element method and calculated stress (von Mises stress) applied to the piezoelectric substrate 2 and the IDT electrode 3. In this simulation, stress which was caused when the temperature changed from about 25° C. to about 85° C. was simulated to verify the operation and effects described above.

Figure 4:
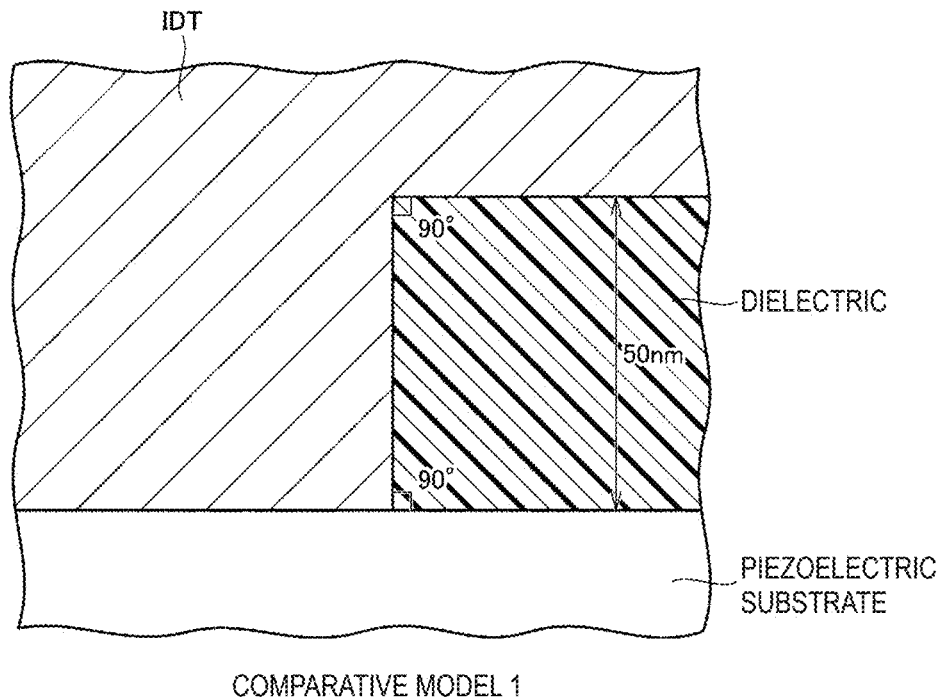
FIG. 4 is a view illustrating a configuration of Comparative Model 1.
Figure 5:
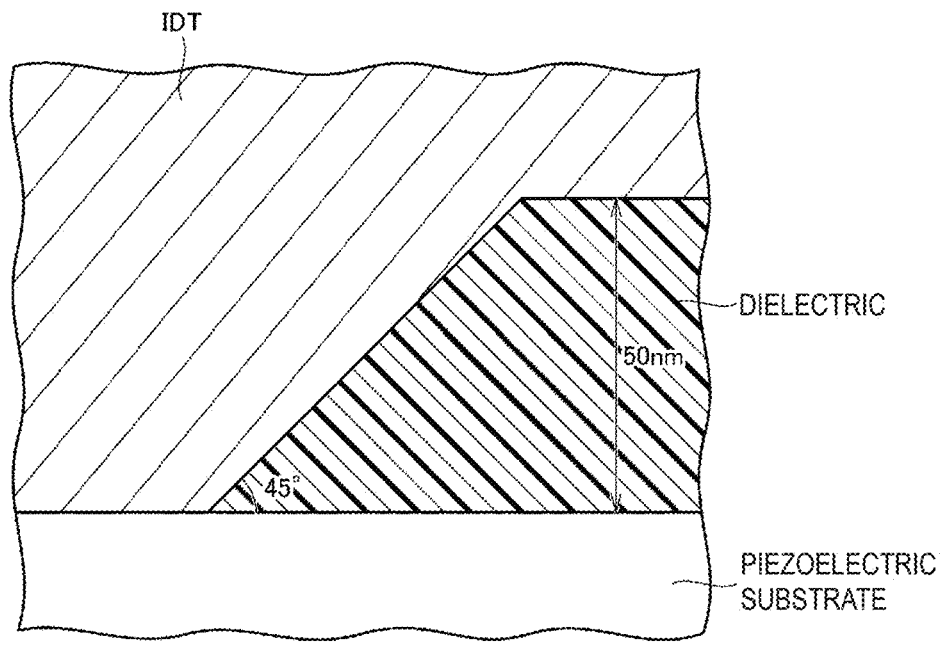
FIG. 5 is a view illustrating a configuration of Comparative Model 2.

Further, in this verification, as a configuration model corresponding to a conventional one, simulations of Comparative Model 1 and Comparative Model 2 were also conducted. FIG. 4 is a view illustrating a configuration of Comparative Model 1. In Comparative Model 1, the side surface of the dielectric has a simple vertical shape. FIG. 5 is a view illustrating a configuration of Comparative Model 2. In Comparative Model 2, the side surface of the dielectric has a simple tapered shape having a tilt angle at 45 degrees.

In these simulations, tantalum oxide ($Ta_2O_5$) with a thickness at about 50 nm is provided as material of the dielectric on a piezoelectric substrate of a 50° Y-cut X propagation $LiTaO_3$, and aluminum with a thickness at about 150 nm is provided as the IDT electrode.

Figure 6:
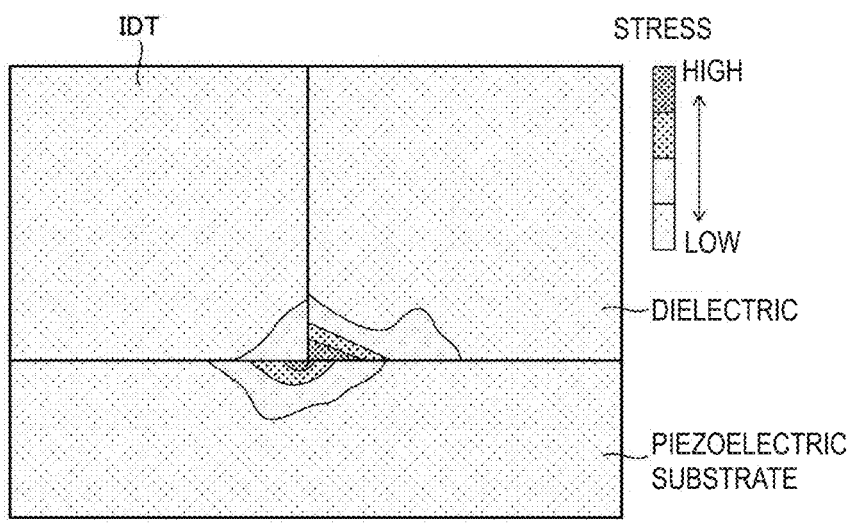
FIG. 6 is a diagram illustrating a simulation result of Comparative Model 1.
Figure 7:
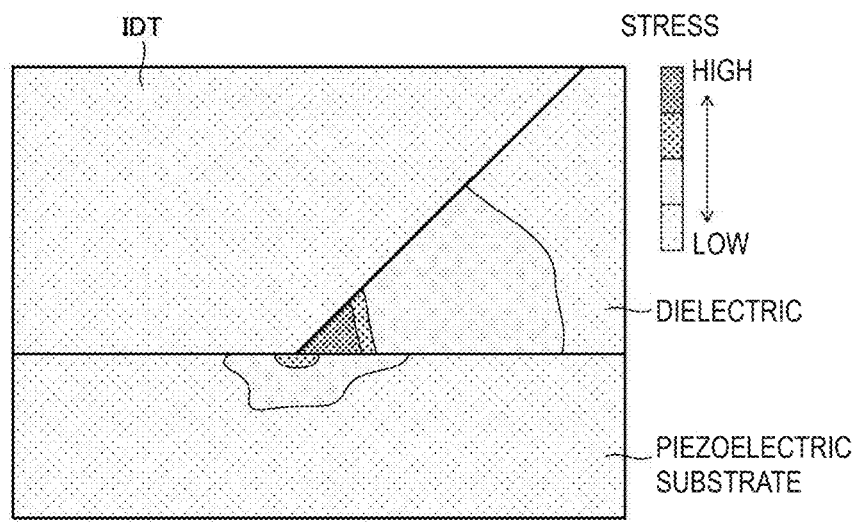
FIG. 7 is a diagram illustrating a simulation result of Comparative Model 2.
Figure 8:
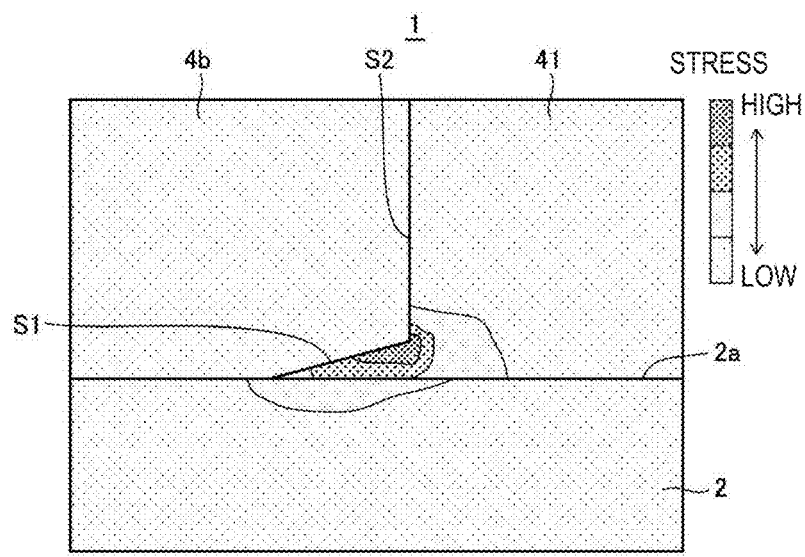
FIG. 8 is a diagram illustrating a simulation result of a model according to a preferred embodiment of the present invention.

FIG. 6 is a diagram illustrating a simulation result of Comparative Model 1. FIG. 7 is a diagram illustrating a simulation result of Comparative Model 2. FIG. 8 is a diagram illustrating a simulation result of a model according to a preferred embodiment of the present invention (for example, the acoustic wave device 1 according to the present preferred embodiment).

Based on the simulation result of Comparative Model 1 illustrated in FIG. 6 and the simulation result of Comparative Model 2 illustrated in FIG. 7, it can be understood that, compared to Comparative Model 1 where the side surface of the dielectric has the vertical shape, the stress applied to the piezoelectric substrate and the IDT electrode becomes lower in Comparative Model 2 where the side surface of the dielectric has the tapered shape, and risk of polarization reversal in the piezoelectric substrate and breaking of the IDT is reduced. However, in Comparative Model 2, since the side surface of the dielectric is inclined, the acoustic velocity changes gradually. Specifically, the acoustic velocity changes within a distance of the side surface of the dielectric in the Y-axis direction (a value obtained by multiplying 50 nm by a square root of 2; approximately 70 nm). Therefore, compared to Comparative Model 1, it is disadvantageous in terms of reducing or preventing the spurious mode (transverse mode).

On the other hand, in the model according to a preferred embodiment of the present invention, the first side surface S1 having a tilt angle at about 15 degrees is provided on the side surface of the first dielectric 41 by a length of about 20 nm in the Y-axis direction, and the other portion (the second side surface S2) has a tilt angle at about 90 degrees. When a simulation result of the model according to a preferred embodiment of the present invention illustrated in FIG. 8 is compared to the simulation result of Comparative Model 1 illustrated in FIG. 6 and the simulation result of Comparative Model 2 illustrated in FIG. 7, it can be seen that, in the model according to a preferred embodiment of the present invention, the stress applied to the piezoelectric substrate 2 is reduced. Therefore, it is apparent that, compared to Comparative Models 1 and 2, the polarization reversal in the piezoelectric substrate 2 is unlikely to occur in the model according to a preferred embodiment of the present invention. Meanwhile, in the model according to a preferred embodiment of the present invention, the portion where the acoustic velocity changes is about 20 nm, and the portion where the acoustic velocity changes can be made smaller compared to Comparative Model 2 where the side surface of the dielectric has the tapered shape. Therefore, compared to Comparative Model 2, reduction or prevention of the transverse mode is facilitated.

When the piezoelectric film of lithium tantalate in the piezoelectric substrate is sufficiently thick, the transverse mode as described above is unlikely to occur. However, similar the piezoelectric substrate 2 according to the present preferred embodiment, in the structure where the piezoelectric film (the piezoelectric layer 21) of lithium tantalate is laminated on the supporting substrate (the high acoustic velocity supporting substrate 23), since the piezoelectric film of lithium tantalate is thin, the transverse mode may be caused. Further, when the piezoelectric film made of lithium niobate is included in the piezoelectric substrate, the transverse mode may be caused even when the piezoelectric film is thick. However, the purpose of the above simulations is to verify how the stress applied to the piezoelectric substrate 2 and the IDT electrode 3 changes corresponding to the change in the shape of the side surface of the dielectric. Therefore, the simulations were conducted by making the piezoelectric substrate 2 as a single layer of lithium tantalate.

As described above, the acoustic wave device 1 according to the present preferred embodiment includes the piezoelectric substrate 2, the IDT electrode 3 provided on the principal surface 2a of the piezoelectric substrate 2, the first dielectrics 41 and 51, and the second dielectrics 42 and 52. The IDT electrode 3 includes the first busbar 4a and the second busbar 5a opposed to each other and extending in the X-axis direction (first direction), the first electrode finger 4b connected at one end to the first busbar 4a and extending toward the second busbar 5a in the Y-axis direction (second direction), and the second electrode finger 5b connected at one end to the second busbar 5a, extending toward the first busbar 4a in the Y-axis direction (second direction), and disposed at a location adjacent to the first electrode finger 4b.

The first dielectrics 41 and 51 are respectively disposed between the tip-end portion of the first electrode finger 4b and the piezoelectric substrate 2 and between the adjacent portion of the second electrode finger 5b and the piezoelectric substrate 2. The second dielectrics 42 and 52 are respectively disposed between the tip-end portion of the second electrode finger 5b and the piezoelectric substrate 2 and between the adjacent portion of the first electrode finger 4b and the piezoelectric substrate 2.

The acoustic wave velocity in the first edge portion A1 and the second edge portion A2 is lower than the acoustic wave velocity in the middle portion B, and the acoustic wave velocity in the first outer portion C1 and the second outer portion C2 is higher than the acoustic wave velocity in the middle portion B.

The side surface of each of the first dielectrics 41 and 51 and the second dielectrics 42 and 52 (the end surface in the Y-axis direction) includes the first side surface S1 in contact with the piezoelectric substrate 2 and the second side surface S2 farther from the piezoelectric substrate 2 than the first side surface S1. The tilt angle of the first side surface S1 is smaller than the tilt angle of the second side surface S2.

As described above, by making the tilt angle of the first side surface S1 relatively smaller, the stress applied to the piezoelectric substrate 2 can be reduced. Further, by making the tilt angle of the second side surface S2 which is farther from the piezoelectric substrate 2 relatively larger, a sharp acoustic velocity difference can be provided between the middle portion B and each of the edge portions A1 and A2 and between the middle portion B and each of the outer portions C1 and C2. As a result, the occurrence of the spurious mode can be reduced or prevented while the polarization reversal in the piezoelectric substrate 2 is reduced or prevented.

Modification 1

The acoustic wave device 1 according to the preferred embodiment described above illustrates an example in which the first side surface S1 and the second side surface S2 are provided on the side surface of each of the dielectrics 41, 51, 42, and 52.

On the other hand, in an acoustic wave device 1A according to Modification 1 of a preferred embodiment of the present invention, in addition to the first side surface S1 and the second side surface S2, a third side surface S3 farther from the piezoelectric substrate 2 than the second side surface S2 is provided on the side surface of each of the dielectrics 41, 51, 42, and 52. The third side surface S3 is one example of a "third surface" in the end surface of each of the dielectrics 41, 51, 42, and 52 in the Y-axis direction. A tilt angle of the third side surface S3 with respect to the principal surface 2a of the piezoelectric substrate 2 (hereinafter, may simply be referred to as a "tilt angle of the third side surface S3") is smaller than the tilt angle of the second side surface S2. Since the side surface shapes of the dielectrics 41, 51, 42, and 52 according to Modification 1 are the same or substantially the same, the first dielectric 41 including the side surface shape according to Modification 1 is referred to below as a "first dielectric 41A", and the side surface shape of the first dielectric 41A is described as an example.

Figure 9:
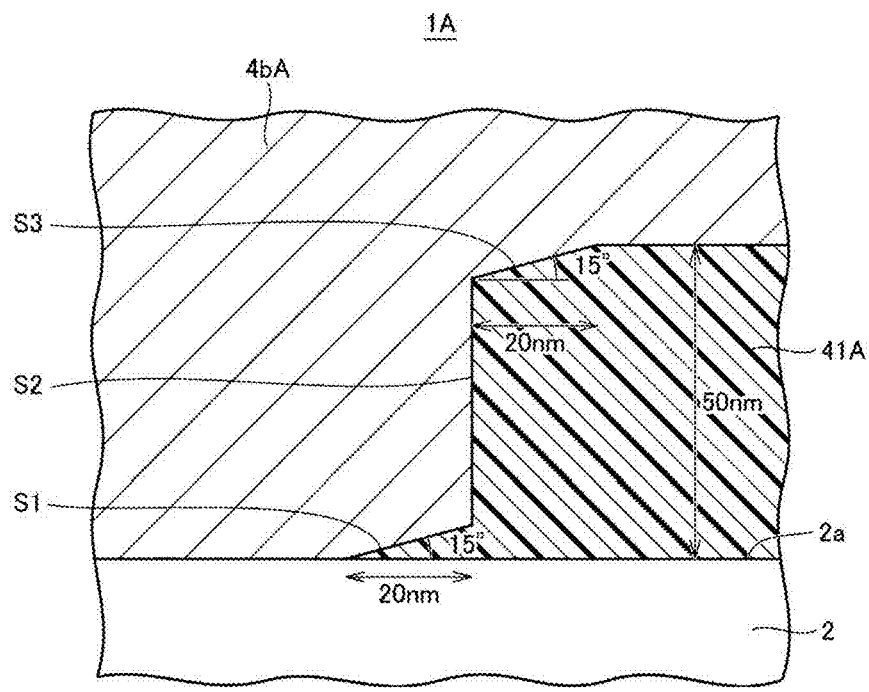
FIG. 9 is an enlarged view of a side surface portion of a dielectric according to a preferred embodiment of the present invention.

FIG. 9 is an enlarged view of a side surface portion of the first dielectric 41A according to Modification 1. In Modification 1, the tilt angle of the first side surface S1 and the tilt angle of the second side surface S2 are respectively, for example, about 15 degrees and about 90 degrees similarly to the preferred embodiment described above. Further, the tilt angle of the third side surface S3 is, for example, about 15 degrees. Moreover, a thickness of the first dielectric 41A (a width in the Z-axis direction) is, for example, about 50 nm, and a length of the first side surface S1 in the Y-axis direction and a length of the third side surface S3 in the Y-axis direction are both, for example, about 20 nm. Note that the values of the tilt angles and lengths of each side surface are merely examples, and not limited thereto.

The inventors of preferred embodiments of the present invention conducted a simulation also for the acoustic wave device 1A according to Modification 1 similar to the present preferred embodiment described above and calculated stress applied to the piezoelectric substrate 2.

Figure 10:
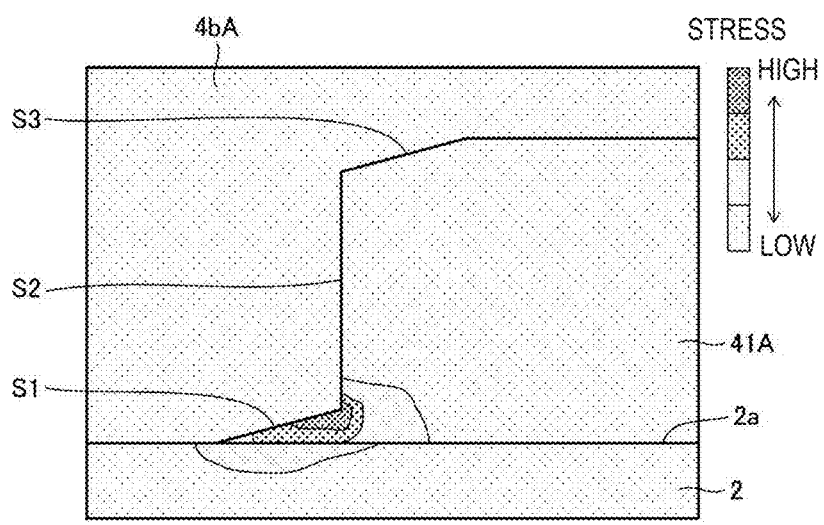
FIG. 10 is diagram illustrating a simulation result of Modified Model 1 according to a preferred embodiment of the present invention.
Figure 11:
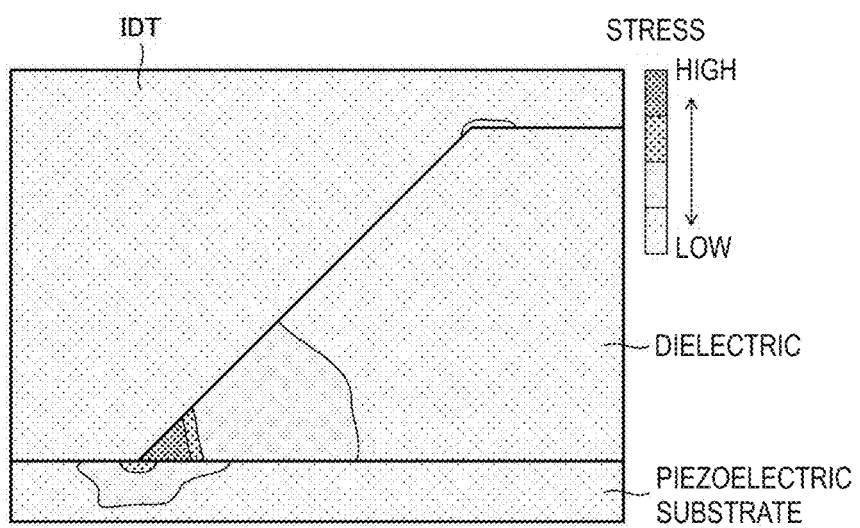
FIG. 11 is a diagram illustrating a simulation result of Comparative Model 2.

FIG. 10 is a diagram illustrating a simulation result of Modified Model 1 (the acoustic wave device 1A according to Modification 1). FIG. 11 is a diagram illustrating a simulation result of above-described Comparative Model 2 where the side surface has the simple tapered shape.

When the simulation result of Modified Model 1 illustrated in FIG. 10 is compared to the simulation result of Comparative Model 2 illustrated in FIG. 11, it can be seen that, in Modified Model 1, the stress applied to the piezoelectric substrate 2 is reduced and the polarization reversal becomes unlikely to occur. Further, it is apparent that, by providing the third side surface S3 with the tilt angle smaller than the tilt angle of the second side surface S2 on the farther side from the piezoelectric substrate 2 than the second side surface S2, stress which acts on a first electrode finger 4bA near an upper end of the side surface of the first dielectric 41A can be slightly reduced.

Meanwhile, in Modified Model 1, a portion in which the acoustic velocity changes is reduced to about 40 nm (the total of the length of the first side surface S1 in the Y-axis direction and the length of the third side surface S3 in the Y-axis direction), and compared to Comparative Model 2 where the side surface of the dielectric has the simple tapered shape, the portion where the acoustic velocity changes can be reduced. Therefore, it can be seen that, compared to Comparative Model 2, the transverse mode can also be reduced or prevented more easily than Comparative Model 2.

As described above, a modification may be applied such that, in addition to the first side surface S1 and the second side surface S2, the third side surface S3 farther from the piezoelectric substrate 2 than the second side surface S2 and having the tilt angle smaller than the tilt angle of the second side surface S2 is formed on the side surface of each dielectric. As a result of such a modification, advantageous operations and effects the same as or similar to the preferred embodiment described above can be achieved. Moreover, by providing the third side surface S3, the stress which acts on the electrode finger around the third side surface S3 can also be reduced.

Modification 2

Although the tilt angle of the second side surface S2 is about 90 degrees in the acoustic wave device 1 according to the present preferred embodiment and the acoustic wave device 1A according to Modification 1, the tilt angle of the second side surface S2 may be smaller than about 90 degrees.

Figure 12:
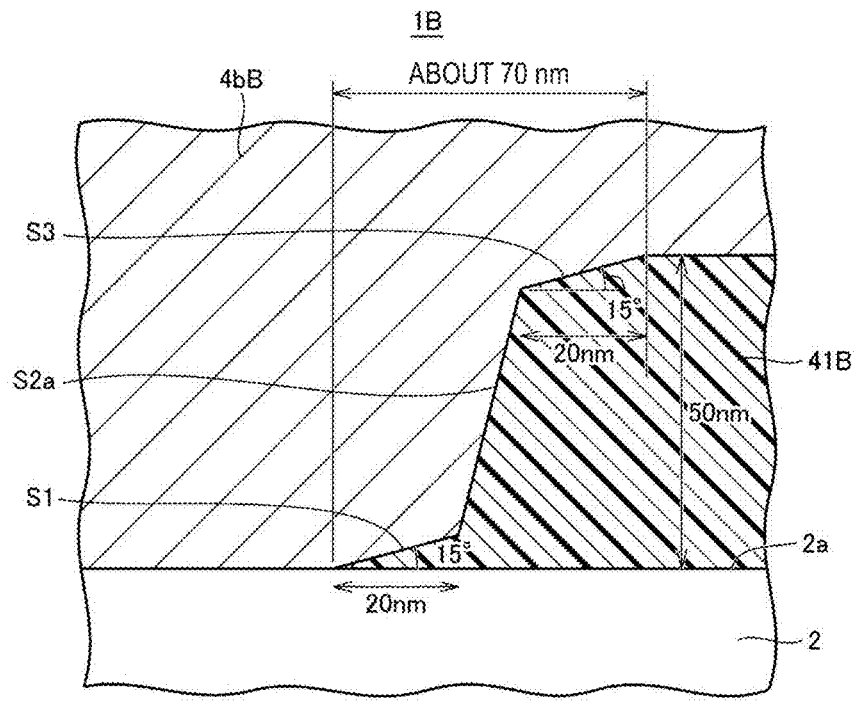
FIG. 12 is an enlarged view of a side surface portion of a dielectric according to a preferred embodiment of the present invention.

FIG. 12 is an enlarged view of a side surface portion of the first dielectric 41 in an acoustic wave device 1B according to Modification 2 of a preferred embodiment of the present invention. Since the side surface shapes of the dielectrics 41, 51, 42, and 52 in the acoustic wave device 1B according to Modification 2 are the same or substantially the same, the first dielectric 41 including the side surface shape according to Modification 2 is referred to below as a "first dielectric 41B", and the side surface shape of the first dielectric 41B is described as an example.

In the first dielectric 41B according to Modification 2, the second side surface S2 of the first dielectric 41A according to Modification 1 described above is changed to a second side surface S2a. That is, on the side surface of the first dielectric 41B, the first side surface S1, the second side surface S2a, and the third side surface S3 are provided. The tilt angle of the first side surface S1 and the tilt angle of the third side surface S3 are both, for example, about 15 degrees similar to Modification 1 described above. A thickness of the first dielectric 41B (a width in the Z-axis direction) is, for example, 50 nm, and the lengths of the first side surface S1 and the third side surface S3 in the Y-axis direction are respectively, for example, about 20 nm. Moreover, a length of the side surface of the first dielectric 41B in the Y-axis direction (a distance between a lower end of the first side surface S1 and an upper end of the third side surface S3 in the Y-axis direction) is a value obtained by, for example, multiplying 50 nm by a square root of 2 (approximately 70 nm) similarly to Comparative Model 2. Therefore, a tilt angle of the second side surface S2a connecting an upper end of the first side surface S1 to a lower end of the third side surface S3 becomes smaller than about 90 degrees.

The inventors of preferred embodiments of the present invention conducted simulation also for the acoustic wave device 1B according to Modification 2 similar to the preferred embodiment described above and calculated stress applied to the piezoelectric substrate 2.

Figure 13:
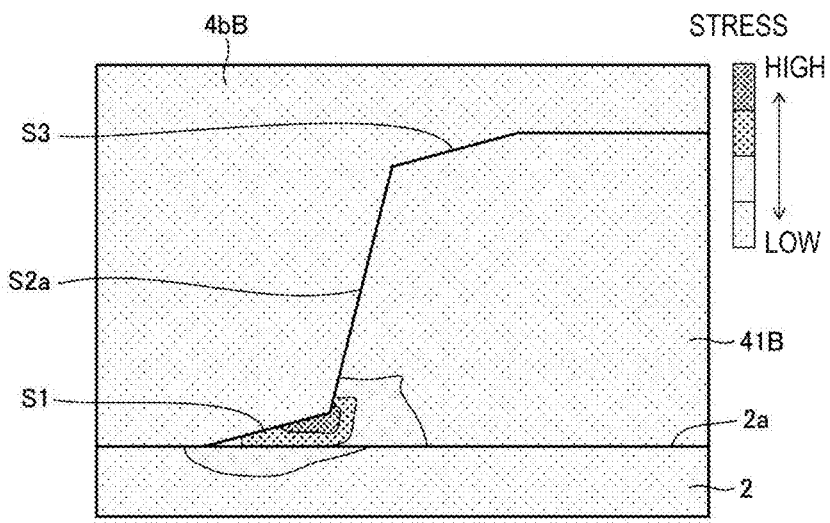
FIG. 13 is a diagram illustrating a simulation result of Modified Model 2 according to a preferred embodiment of the present invention.

FIG. 13 is a diagram illustrating a simulation result of Modified Model 2 (the acoustic wave device 1B according to Modification 2).

When the simulation result of Modified Model 2 illustrated in FIG. 13 is compared to the simulation result of Comparative Model 2 illustrated in FIG. 11, it can be seen that, in Modified Model 2, the stress applied to the piezoelectric substrate 2 is reduced and the polarization reversal becomes unlikely to occur. Further, in Modified Model 2, by making the tilt angle of the third side surface S3 smaller than about 90 degrees, stress which acts on a first electrode finger 4bB near the third side surface S3 can be slightly reduced.

Meanwhile, in Modified Model 2, a portion in which the acoustic velocity changes is approximately 70 nm, and is reduced to the same or substantially the same level as Comparative Model 2. Therefore, an increase in the transverse mode can be reduced or prevented compared to Comparative Model 2.

As described above, the tilt angle of the second side surface S2 may be smaller than about 90 degrees. As a result, the stress which acts on the electrode finger can appropriately be reduced while achieving advantageous operation and effects similar to the preferred embodiment described above.

Modification 3

The preferred embodiment described above illustrates the example where the first dielectric 41 or 51 is provided to every tip-end portion of the first electrode finger 4b and adjacent portion of the second electrode finger 5b included in the first edge portion A1.

However, some of the first dielectrics 41 and 51 disposed in the first edge portion A1 may be omitted as long as the velocity distribution in the piston mode is provided. For example, it is possible that the first dielectric 41 is provided to the tip-end portion of the first electrode finger 4b and the first dielectric 51 is not provided to the adjacent portion of the second electrode finger 5b. Conversely, it is also possible that the first dielectric 51 is provided to the adjacent portion of the second electrode finger 5b and the first dielectric 41 is not provided to the tip-end portion of the first electrode finger 4b.

Similarly, the preferred embodiment described above illustrates an example where the second dielectric 42 or 52 is provided to every tip-end portion of the second electrode finger 5b and adjacent portion of the first electrode finger 4b included in the second edge portion A2.

However, some of the second dielectrics 42 and 52 disposed in the second edge portion A2 may be omitted as long as the velocity distribution in the piston mode is provided. For example, it is possible that the second dielectric 52 is provided to the tip-end portion of the second electrode finger 5b and the second dielectric 42 is not provided to the adjacent portion of the first electrode finger 4b. Further, it is also possible that the second dielectric 42 is provided to the adjacent portion of the first electrode finger 4b and the second dielectric 52 is not provided to the tip-end portion of the second electrode finger 5b.

Modification 4

The preferred embodiment described above illustrates the example where the first dielectrics 41 and 51 are separately provided to the tip-end portion of the first electrode finger 4b and the adjacent portion of the second electrode finger 5b included in the first edge portion A1, respectively.

However, the dielectrics provided to the tip-end portion of the first electrode finger 4b and the adjacent portion of the second electrode finger 5b are not limited to being provided separately, but may be provided integrally.

Similarly, the preferred embodiment described above illustrates an example where the second dielectrics 52 and 42 are separately provided to the tip-end portion of the second electrode finger 5b and the adjacent portion of the first electrode finger 4b included in the second edge portion A2, respectively.

However, the dielectrics provided to the tip-end portion of the second electrode finger 5b and the adjacent portion of the first electrode finger 4b are not limited to being provided separately, but may be provided integrally.

Figure 14:
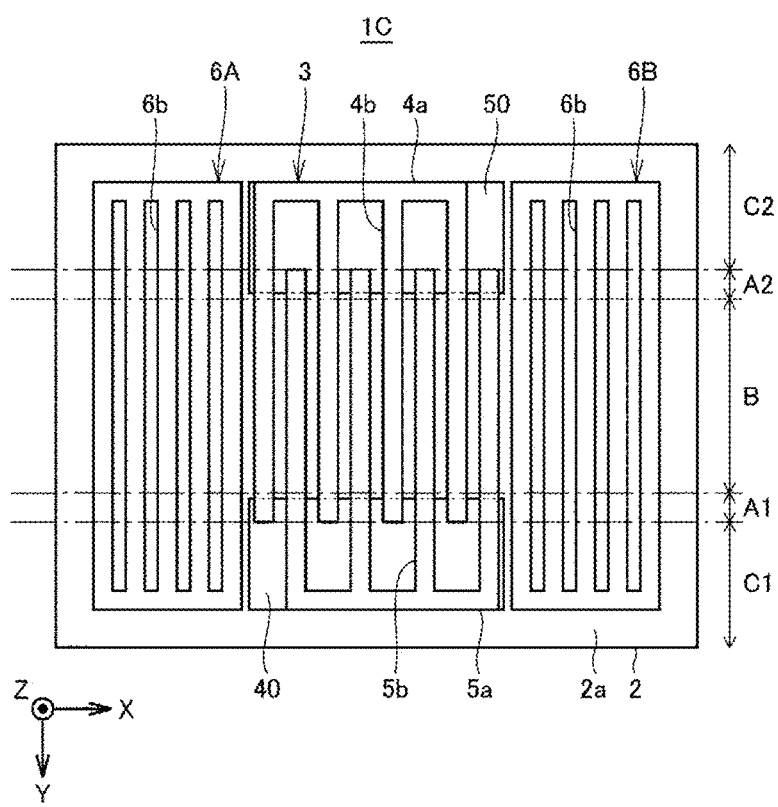
FIG. 14 is a plan view of an acoustic wave device according to a preferred embodiment of the present invention.

FIG. 14 is a plan view of an acoustic wave device 1C according to Modification 4. In the acoustic wave device 1C illustrated in FIG. 14, the first dielectrics 41 and 51 of the acoustic wave device 1 illustrated in FIG. 1 are changed to a "first dielectric 40", and the second dielectrics 42 and 52 of the acoustic wave device 1 are changed to a "second dielectric 50". Since other configurations of the acoustic wave device 1C are the same or substantially the same as those of the acoustic wave device 1 described above, detailed description is not repeated here.

The first dielectric 40 is provided to a large portion including the tip-end portion of the first electrode finger 4b and the adjacent portion of the second electrode finger 5b included in the first edge portion A1 and also including the portion of the second electrode finger 5b and the second busbar 5a included in the first outer portion C1, and the first dielectric 40 extends integrally.

The second dielectric 50 is provided to a large portion including the tip-end portion of the second electrode finger 5b and the adjacent portion of the first electrode finger 4b included in the second edge portion A2 and also including the portion of the first electrode finger 4b and the first busbar 4a included in the second outer portion C2, and the second dielectric 50 extends integrally.

Such a first dielectric 40 and a second dielectric 50 can also reduce or prevent a spurious response utilizing the piston mode. That is, the acoustic wave device 1C according to Modification 4 is configured such that the acoustic wave velocity in the first edge portion A1 and the second edge portion A2 is lower than that in the middle portion B and the portion where the acoustic wave velocity is higher than that in the middle portion B exists in the first outer portion C1 and the second outer portion C2. Therefore, the acoustic wave velocity is configured to be distributed in an order of the intermediate velocity, the low velocity, and the high velocity from the middle portion B toward both outer side portions in the Y-axis direction. As a result, the acoustic wave device 1C according to Modification 4 can also reduce or prevent a spurious response utilizing the piston mode. The first dielectric 40 and the second dielectric 50 are unnecessarily provided to a portion including a portion of the first outer portion C1 and second outer portion C2, as long as they are provided to the first edge portion A1 and the second edge portion A2, respectively.

Modification 5

The acoustic wave device 1 according to the preferred embodiment described above may be provided with a protective film covering an upper surface of the IDT electrode 3 (an end surface in the Z-axis positive direction).

Figure 15:
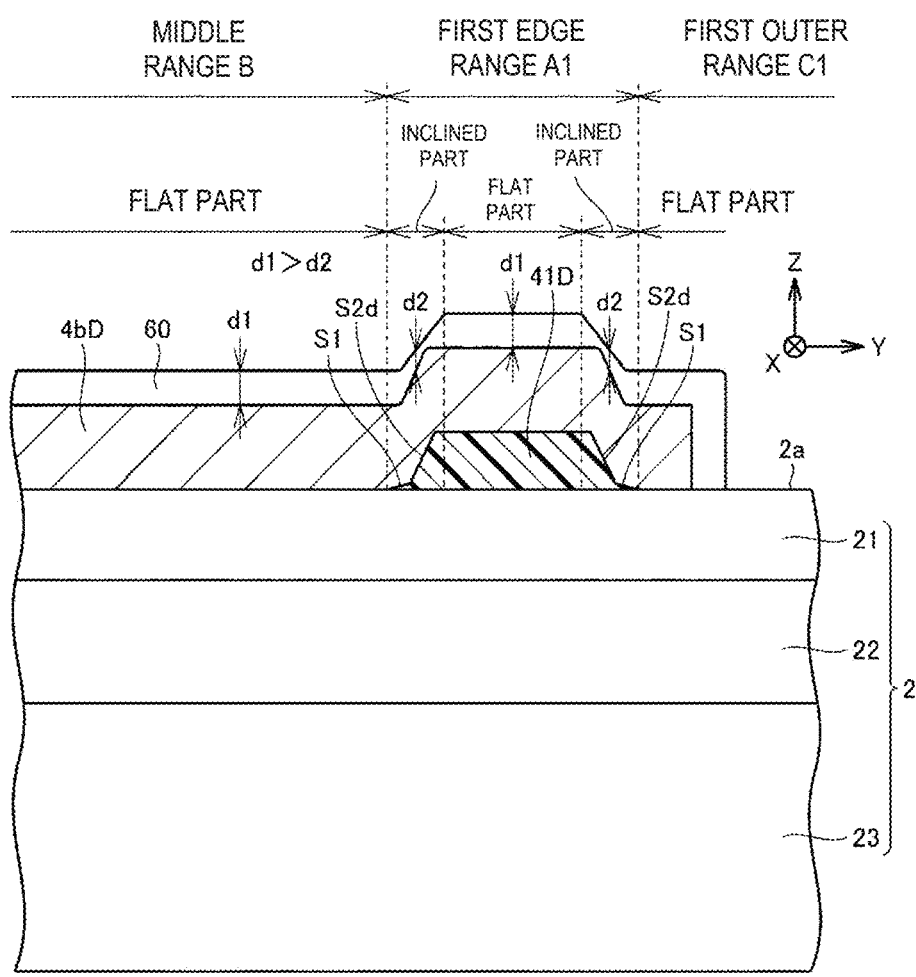
FIG. 15 is a sectional view of an acoustic wave device according to a preferred embodiment of the present invention.

FIG. 15 is a sectional view of an acoustic wave device 1D according to Modification 5 of a preferred embodiment of the present invention. In the acoustic wave device 1D illustrated in FIG. 15, the first dielectric 41 and the first electrode finger 4b of the above-described acoustic wave device 1 illustrated in FIG. 2 are respectively changed to a "first dielectric 41D" and a "first electrode finger 4bD", and a protective film 60 covering the upper surface of the IDT electrode 3 (the end surface in the Z-axis positive direction) is added. Although not illustrated in FIG. 15, each of the dielectrics 51, 42, and 52 other than the first dielectric 41 and the second electrode finger 5b are also changed the same as or similarly to the first dielectric 41D and the first electrode finger 4bD in the acoustic wave device 1D. Since other configurations of the acoustic wave device 1D are the same as or similar to those of the acoustic wave device 1 described above, detailed description is not repeated here.

In the first dielectric 41D, the above-described second side surface S2 of the first dielectric 41 illustrated in FIG. 2 is changed to a "second side surface S2d". A tilt angle of the second side surface S2d is larger than the tilt angle of the first side surface S1 (for example, approximately 15 degrees) and smaller than about 90 degrees (approximately 50 degrees in the example illustrated in FIG. 15). That is, the second side surface S2d of the first dielectric 41D is not flat but is inclined with respect to the principal surface 2a of the piezoelectric substrate 2.

The first dielectric 41D is disposed between the tip-end portion of the first electrode finger 4bD and the piezoelectric substrate 2. Since the second side surface S2d of the first dielectric 41D is inclined with respect to the principal surface 2a of the piezoelectric substrate 2, a portion of the first electrode finger 4bD located on the upper surface of the second side surface S2d of the first dielectric 41D is also inclined with respect to the principal surface 2a of the piezoelectric substrate 2.

The protective film 60 covers the upper surface of the first dielectric 41D (the end surface in the Z-axis positive direction). Therefore, a portion of the protective film 60 located on the upper surface of the second side surface S2d of the first dielectric 41D is also inclined with respect to the principal surface 2a of the piezoelectric substrate 2. Thus, the protective film 60 includes a flat portion which is flat with respect to the principal surface 2a of the piezoelectric substrate 2 and an inclined portion which is inclined with respect to the principal surface 2a of the piezoelectric substrate 2. The inclined portion of the protective film 60 is provided in a boundary portion of the first edge portion A1 with the middle portion B and a boundary portion of the first edge portion A1 with the first outer portion C1.

Although not illustrated in FIG. 15, the inclined portion of the protective film 60 is also provided in a boundary portion of the second edge portion A2 with the middle portion B and a boundary portion of the second edge portion A2 with the second outer portion C2.

With such a configuration, the protective film 60 according to Modification 5 is provided such that a thickness (a dimension in the Z-axis direction) d2 of the inclined portion of the protective film 60 is thinner than a thickness d1 of the flat part (d2<d1). By making the thickness d2 of the inclined portion of the protective film 60 thinner than the thickness d1 of the flat portion, a sharper acoustic velocity difference can be provided between the middle portion B and the first edge portion A1 and between the first edge portion A1 and the first outer portion C1.

Figure 16:
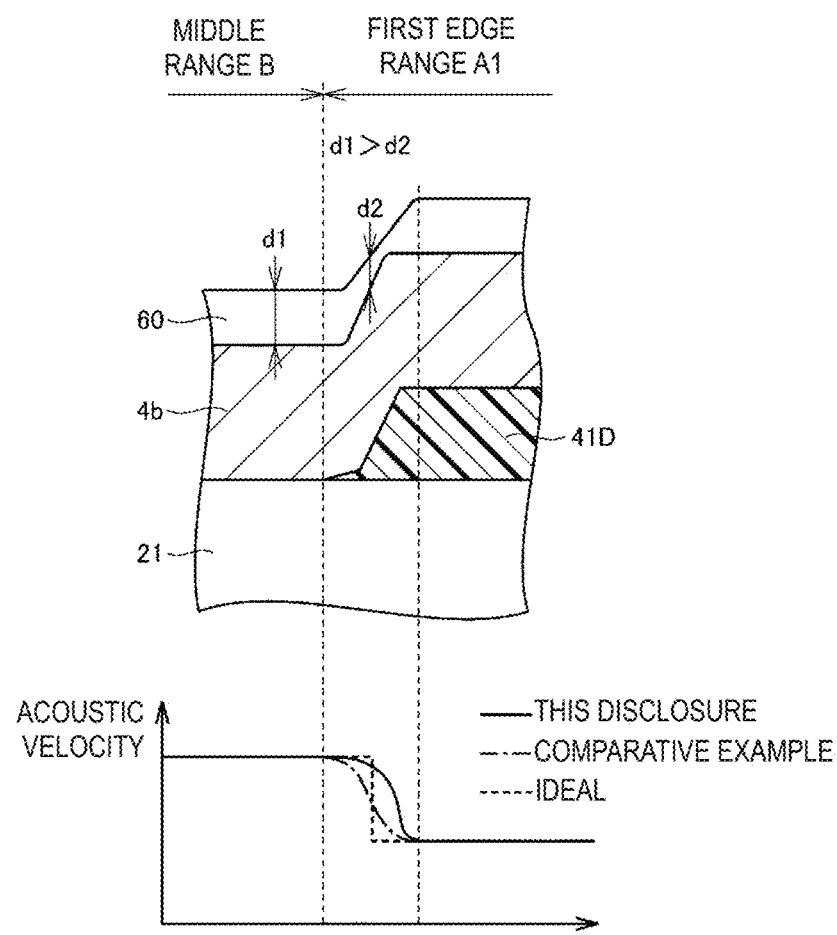
FIG. 16 is a diagram illustrating one example of a simulation result of an acoustic velocity difference between a middle portion B and a first edge portion A1.

FIG. 16 is a diagram illustrating one example of a simulation result of the acoustic velocity difference between the middle portion B and the first edge portion A1 when the acoustic wave device 1D according to Modification 5 is used. In FIG. 16, a simulation result in a case where the thickness d1 of the flat portion of the protective film 60 is the same or substantially the same as the thickness d2 of the inclined portion is indicated by a one-dot chain line as a comparative example to Modification 5.

Based on the simulation result illustrated in FIG. 16, it can be understood that, compared to the comparative example (the one-dot chain line) where the thickness d1 of the flat portion of the protective film 60 is the same or substantially the same as the thickness d2 of the inclined portion, Modification 5 (present disclosure; solid line) where the thickness d2 of the inclined portion of the protective film 60 is thinner than the thickness d1 of the flat portion can further sharpen the change in the acoustic velocity difference between the middle portion B and the first edge portion A1. Therefore, Modification 5 can further effectively reduce or prevent a transverse-mode spurious response and efficiently propagate the fundamental mode.

In Modification 5, the inclined portion of the protective film 60 is provided in all the four boundary portions: the boundary portion of the first edge portion A1 with the middle portion B, the boundary portion of the first edge portion A1 with the first outer portion C1, the boundary portion of the second edge portion A2 with the middle portion B, and the boundary portion of the second edge portion A2 with the second outer portion C2. However, the inclined portion of the protective film 60 according to Modification 5 is unnecessarily limited to be provided in all the four boundary portions described above, but may be provided in at least one of the four boundary portions.

Further, in the acoustic wave device 1D according to Modification 5, the first dielectric 41D includes the first side surface S1 and the second side surface S2d. However, the first dielectric 41D is unnecessarily limited to include both of the first side surface S1 and the second side surface S2d. For example, the first dielectric 41D may be modified to be a dielectric in which the first side surface S1 is omitted from the first dielectric 41D and the side surface (the end surface in the Y-axis direction) is entirely provided by the second side surface S2d. The dielectrics 51, 42, and 52 other than the first dielectric 41D may similarly be modified.

The characteristics in the preferred embodiment and Modifications 1 to 5 described above may be combined as appropriate within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a piezoelectric substrate;
an IDT electrode on a principal surface of the piezoelectric substrate;
a first dielectric; and
a second dielectric; wherein
the IDT electrode includes:
a first busbar and a second busbar opposed to each other;
a first electrode finger connected at one end to the first busbar and extending toward the second busbar; and a second electrode finger connected at one end to the second busbar and extending toward the first busbar;

the first electrode finger and the second electrode finger are interdigitated with each other;

the first dielectric is between at least one of a tip-end portion of the first electrode finger and a portion of the second electrode finger and the piezoelectric substrate, the portion of the second electrode finger being adjacent to the tip-end portion of the first electrode finger;

the second dielectric is between at least one of a tip-end portion of the second electrode finger and a portion of the first electrode finger and the piezoelectric substrate, the portion of the first electrode finger being adjacent to the tip-end portion of the second electrode finger;

when a portion including the tip-end portion of the first electrode finger is a first edge portion, a portion including the tip-end portion of the second electrode finger is a second edge portion, a portion between the first edge portion and the second edge portion is a middle portion, a portion on an outer side of the first edge portion with respect to the middle portion is a first outer portion, and a portion on an outer side of the second edge portion with respect to the middle portion is a second outer portion, an acoustic wave velocity in the first edge portion and the second edge portion is lower than an acoustic wave velocity in the middle portion, and a portion in which an acoustic wave velocity is higher than the acoustic wave velocity in the middle portion is provided in the first outer portion and the second outer portion;

in each of the first dielectric and the second dielectric, at least one of an end surface in an extending direction of the first electrode finger and an end surface in an extending direction of the second electrode finger includes a first surface and a second surface farther from the piezoelectric substrate than the first surface; and a tilt angle of the first surface with respect to the principal surface of the piezoelectric substrate is smaller than a tilt angle of the second surface with respect to the principal surface of the piezoelectric substrate.

2. The acoustic wave device according to claim 1, wherein in each of the first dielectric and the second dielectric, at least one of the end surface in the extending direction of the first electrode finger and the end surface in the extending direction of the second electrode finger includes a third surface farther from the piezoelectric substrate than the second surface; and a tilt angle of the third surface with respect to the principal surface of the piezoelectric substrate is smaller than the tilt angle of the second surface with respect to the principal surface of the piezoelectric substrate.

3. The acoustic wave device according to claim 1, wherein the tilt angle of the second surface with respect to the principal surface of the piezoelectric substrate is smaller than about 90 degrees.

4. The acoustic wave device according to claim 1, wherein the piezoelectric substrate includes lithium tantalate.

5. The acoustic wave device according to claim 1, wherein the piezoelectric substrate includes:
a piezoelectric film;
a low velocity layer laminated on the piezoelectric film on an opposite side from the IDT electrode and configured such that an acoustic velocity of a bulk wave propagating therein is lower than an acoustic velocity of an acoustic wave propagating on or in the piezoelectric film; and
a high acoustic velocity supporting substrate laminated on the low velocity layer on an opposite side from the IDT electrode and configured such that an acoustic velocity of a bulk wave propagating therein is higher than the acoustic velocity of the acoustic wave propagating on or in the piezoelectric film.

6. The acoustic wave device according to claim 1, further comprising:
a protective film covering the IDT electrode; wherein the protective film includes:
an inclined portion in at least one of a boundary portion between the first edge portion and the middle portion, a boundary portion between the first edge portion and the first outer portion, a boundary portion between the second edge portion and the middle portion, and a boundary portion between the second edge portion and the second outer portion, and inclined with respect to the principal surface of the piezoelectric substrate; and
a flat portion in a portion other than the inclined portion and flat with respect to the principal surface of the piezoelectric substrate; and
a thickness of the inclined portion of the protective film is thinner than a thickness of the flat portion of the protective film.

7. The acoustic wave device according to claim 2, wherein the tilt angle of the second surface with respect to the principal surface of the piezoelectric substrate is smaller than about 90 degrees.

8. The acoustic wave device according to claim 2, wherein the piezoelectric substrate includes lithium tantalate.

9. The acoustic wave device according to claim 2, wherein the piezoelectric substrate includes:
a piezoelectric film;
a low velocity layer laminated on the piezoelectric film on an opposite side from the IDT electrode and configured such that an acoustic velocity of a bulk wave propagating therein is lower than an acoustic velocity of an acoustic wave propagating on or in the piezoelectric film; and
a high acoustic velocity supporting substrate laminated on the low velocity layer on an opposite side from the IDT electrode and configured such that an acoustic velocity of a bulk wave propagating therein is higher than the acoustic velocity of the acoustic wave propagating on or in the piezoelectric film.

10. The acoustic wave device according to claim 2, further comprising:
a protective film covering the IDT electrode; wherein the protective film includes:
an inclined portion in at least one of a boundary portion between the first edge portion and the middle portion, a boundary portion between the first edge portion and the first outer portion, a boundary portion between the second edge portion and the middle portion, and a boundary portion between the second edge portion and the second outer portion, and inclined with respect to the principal surface of the piezoelectric substrate; and
a flat portion in a portion other than the inclined portion and flat with respect to the principal surface of the piezoelectric substrate; and
a thickness of the inclined portion of the protective film is thinner than a thickness of the flat portion of the protective film.

11. The acoustic wave device according to claim 3, wherein the piezoelectric substrate includes lithium tantalate.

12. The acoustic wave device according to claim 3, wherein
the piezoelectric substrate includes:
a piezoelectric film;
a low velocity layer laminated on the piezoelectric film on an opposite side from the IDT electrode and configured such that an acoustic velocity of a bulk wave propagating therein is lower than an acoustic velocity of an acoustic wave propagating on or in the piezoelectric film; and
a high acoustic velocity supporting substrate laminated on the low velocity layer on an opposite side from the IDT electrode and configured such that an acoustic velocity of a bulk wave propagating therein is higher than the acoustic velocity of the acoustic wave propagating on or in the piezoelectric film.

13. The acoustic wave device according to claim 3, further comprising:
a protective film covering the IDT electrode; wherein
the protective film includes:
an inclined portion in at least one of a boundary portion between the first edge portion and the middle portion, a boundary portion between the first edge portion and the first outer portion, a boundary portion between the second edge portion and the middle portion, and a boundary portion between the second edge portion and the second outer portion, and inclined with respect to the principal surface of the piezoelectric substrate; and
a flat portion in a portion other than the inclined portion and flat with respect to the principal surface of the piezoelectric substrate; and
a thickness of the inclined portion of the protective film is thinner than a thickness of the flat portion of the protective film.

14. The acoustic wave device according to claim 4, wherein
the piezoelectric substrate includes:
a piezoelectric film;
a low velocity layer laminated on the piezoelectric film on an opposite side from the IDT electrode and configured such that an acoustic velocity of a bulk wave propagating therein is lower than an acoustic velocity of an acoustic wave propagating on or in the piezoelectric film; and
a high acoustic velocity supporting substrate laminated on the low velocity layer on an opposite side from the IDT electrode and configured such that an acoustic velocity of a bulk wave propagating therein is higher than the acoustic velocity of the acoustic wave propagating on or in the piezoelectric film.

15. The acoustic wave device according to claim 4, further comprising:
a protective film covering the IDT electrode; wherein
the protective film includes:
an inclined portion in at least one of a boundary portion between the first edge portion and the middle portion, a boundary portion between the first edge portion and the first outer portion, a boundary portion between the second edge portion and the middle portion, and a boundary portion between the second edge portion and the second outer portion, and inclined with respect to the principal surface of the piezoelectric substrate; and
a flat portion in a portion other than the inclined portion and flat with respect to the principal surface of the piezoelectric substrate; and
a thickness of the inclined portion of the protective film is thinner than a thickness of the flat portion of the protective film.

16. The acoustic wave device according to claim 5, further comprising:
a protective film covering the IDT electrode; wherein
the protective film includes:
an inclined portion in at least one of a boundary portion between the first edge portion and the middle portion, a boundary portion between the first edge portion and the first outer portion, a boundary portion between the second edge portion and the middle portion, and a boundary portion between the second edge portion and the second outer portion, and inclined with respect to the principal surface of the piezoelectric substrate; and
a flat portion in a portion other than the inclined portion and flat with respect to the principal surface of the piezoelectric substrate; and
a thickness of the inclined portion of the protective film is thinner than a thickness of the flat portion of the protective film.

* * * * *